METHOD OF HEAT TREATING SEMICONDUCTOR ELECTROLUMINESCENT DEVICES

Filed Dec. 1, 1967 4 Sheets-Sheet 1

INVENTORS
MAX R. LORENZ
AARE ONTON

BY John E Dougherty Jr
ATTORNEY

METHOD OF HEAT TREATING SEMICONDUCTOR ELECTROLUMINESCENT DEVICES

Filed Dec. 1, 1967

United States Patent Office 3,540,941
Patented Nov. 17, 1970

3,540,941

METHOD OF HEAT TREATING SEMICONDUCTOR ELECTROLUMINESCENT DEVICES

Max R. Lorenz, Mahopac, and Aare Onton, Yorktown Heights, N.Y., assignors to International Business Machines Corporation, Armonk, N.Y., a corporation of New York Filed Dec. 1, 1967, Ser. No. 687,264
Int. Cl. H01l 7/34, 7/38
U.S. Cl. 148—1.5 17 Claims

ABSTRACT OF THE DISCLOSURE

GaP electroluminescent diodes, fabricated using a solution growth process, are heat treated to enhance their light emitting characteristics in a particular portion of the electromagnetic spectrum. The heat treatment is carried out either after the diodes are fabricated, or the heat treatment is incorporated as part of the solution growth process. The recombination region in these diodes is the p region which is doped with zinc and partly compensated with oxygen. The original wafer from which the diode is prepared is p type and contains both zinc and oxygen. The junction and n type region, doped with tellurium, are prepared using the solution growth process. The zinc and oxygen atoms in the p region can exist in either an associated state or in a dissociated state. When in the associated state, the transition energy for electron-hole recombination at the zinc-oxygen pair is about 1.80 electron-volt (red emission). When in a dissociated state the transition energy is about 1.35 electron-volt (infrared emission). Heat treating the diode at higher temperatures (900° C.), causes the zinc and oxygen atoms to dissociate thereby enhancing the infrared emission at the expense of red emission. This infrared emission is inherently less efficient in GaP than the red emission. Heat treatment to produce the red emission, which is more desirable because it is visible and is more efficient, is carried out in a lower temperature range (450–700° C.). Heating in this temperature range causes the zinc and oxygen impurities to associate as nearest neighbors, and produce the state within the material which is more conducive to efficient production of red emission. The time for the heat treatment is carefully controlled since continued heating in either temperature range causes other changes within the diode, which degrade the over-all light emitting efficiency. Degradation begins to set in, and lessens the initial enhancement produced by heating, after about five minutes at 700° C. At the lower temperature 500° C., the heat treatment can be carried out for periods up to three hours before the degradation effects become pronounced. A diode, once fabricated, can be tested to determine if heat treating will improve its red emission. If the output of the diode includes a relatively high amount of infrared, heat treating in the lower temperature range will improve the emission in the red.

FIELD OF THE INVENTION

The invention relates to a method of producing efficient recombination radiation devices. More specifically, it relates to devices including a semi-conductor region into which carriers are injected and there recombine to produce recombination radiation. In the method of the present invention the recombination radiation region includes both acceptor and donor impurities which may exist in either an associated or dissociated state. Transitions between the energy levels for the dissociated pairs produce output radiation at a frequency which is lower than that produced by transitions between the energy levels of pairs which are associated. Heat treating at lower temperatures tends to cause more pairs to become associated and heat treating at higher temperatures causes the pairs to dissociate. The heat treating must be carefully controlled since prolonged application of heat in any temperature range tends to degrade the over-all efficiency of the diode so that the maximum attainable efficiency is not obtained.

PRIOR ART

The most pertinent art is found in an article by Logan et al. which appeared at page 206 of Applied Physics Letters, vol. 10, No. 7, Apr. 1, 1967.

This article discloses a method of heat treating solution grown GaP diodes which have a p type recombination radiation region doped with zinc and oxygen. In accordance with the teaching of this article, the overall light emitting efficiency of diodes of this type is significantly improved by annealing the diodes at temperatures in the range between 400° C. and 725° C. Maximum efficiencies are stated to be obtained after annealing these diodes for about sixteen hours after which continued heating does not affect the efficiency.

SUMMARY OF THE INVENTION

In accordance with the principles of the present invention, a method of heat treating diodes is provided which makes it possible to produce diodes with improved efficiencies in a particular one of at least two different frequency ranges. Further, by controlling both the temperature and time during which the heat treatment is carried out, the maximum efficiency enhancement in the desired frequency range is obtained. The heat treatment is terminated at a particular temperature before the initial efficiency enhancement is seriously degraded by other effects which the heating produces in the diodes.

More specifically, the inventive method is applied to semiconductor diodes having a recombination radiation region which includes both donor and acceptor impurity atoms that may exist in either an associated or dissociated state. Light emission produced by transitions between associated pairs is at a higher frequency than emission produced by transitions between dissociated pairs. Though it has been known that heat treatment of GaP diodes of this type improves the efficiency of such diodes (see above-cited prior art article), it has not been known that heat treatment at selected temperatures for selected times can be used to change the efficiency at a particular frequency by causing the zinc and oxygen impurities to either associate or dissociate. Further, in accordance with the teachings of this invention, the time of the annealing or heat treatment is carefully controlled, since though it is true that prolonged heating does produce an over-all enhancement in many diodes, a peak efficiency is rapidly obtained after rather short periods of heating, and further heating causes other changes to occur within the diode which decreases the over-all diode efficiency. The heat treatment can be carried out after the diodes are fabricated using conventional solution growth techniques; or the cooling cycles used during the actual solution growth can be carefully controlled both to avoid prolonged heating at temperatures which degrade diode efficency. and carry out the annealing at the proper temperature for the proper time to maximize the emission efficiency in a particular frequency range.

The practice of the invention is of particular significance when applied to GaP diodes doped with impurities such as zinc and oxygen, since by heat treating in the correct temperatures range for a limited time, the efficiency of the light emission in the inherently more efficient and more desirable red frequency range can be maximized. However, in its broadest scope the practice of the invention is not limited to these particular impurities, since other paired type impurities, such as cadmium and oxygen, zinc and sulphur, and carbon and oxygen can be employed in GaP. Nor is the practice of the invention limited to GaP, since the controlled heat treatment may be applied to other semiconductors with different dopants to either associate or dissociate pairs and thereby enhance the light emitting efficiency at a particular frequency range. Diodes of this type may also be tested to determine whether heat treatment will improve the efficiency in a particular frequency range. Thus, a GaP diode of the type described can be operated and the light emission in the red and infrared measured. If the output has a relatively high infrared output, then heat treatment should increase the efficiency of the red emission.

OBJECTS

It is a prime object of this invention to provide a method of fabricating recombination radiation devices which produce efficient light in the visible portion of the electromagnetic spectrum.

It is a more specific object to provide an improved method of heat treating GaP electroluminescent diodes to optimize the efficiency with which these diodes produce red emission.

It is another object of this invention to provide a method of fabricating recombination radiation devices so that the efficiency of the light output in one of two possible output frequency ranges is maximized.

It is a further object to provide a method for quickly determining if the output of a diode of this type at a particular frequency can be appreciably improved by heat treating.

The foregoing and other objects, features and advantages of the invention will be apparent from the following more particular description of preferred embodiments of the invention, as illustrated in the accompanying drawings.

DESCRIPTION OF PREFERRED EMBODIMENTS

The method of the present invention may be practiced with GaP diodes made by conventional methods and the initial portion of this specification is directed to a description of the method of heat treating such diodes. Later in the specification there is included a description of a method of preparing such diodes, which takes advantage of the discoveries that provide the basis for the inventive method to which this application is directed.

Figure 1:
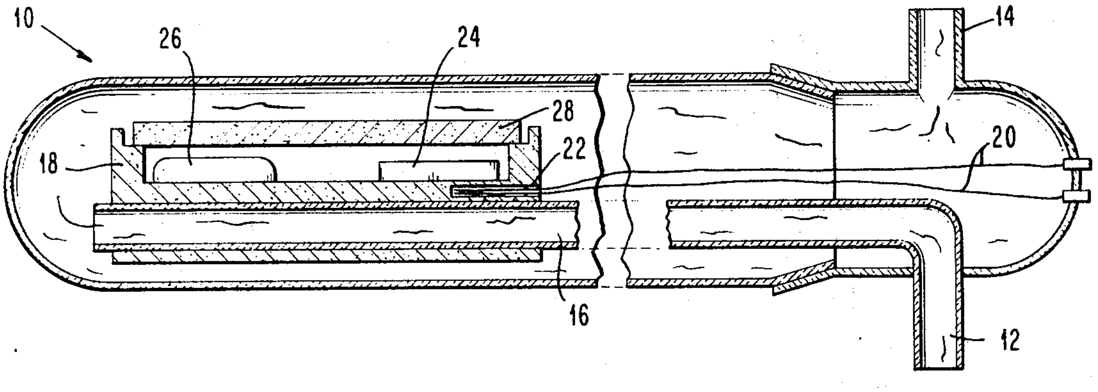
FIG. 1 is a somewhat schematic representation of an apparatus used to prepare GaP diodes by a solution growth process.

FIG. 1 shows a prior art apparatus which may be used for the preparation of GaP diodes. The apparatus is a horizontal solution growth apparatus and includes a quartz tube 10 which has an inlet passage 12 to admit forming gas and an outlet passage 14 for this gas. Inlet passage 12 is connected to a conduit 16 which supports a graphite boat 18. A pair of wires 20 extend to thermocouple 22 embedded in boat 18. A subtrate 24 on which the epitaxial growth is to take place is placed in boat 18 as well as a solid solution 26 of the material which is to be grown on substrate 24.

The substrate 24 is a GaP substrate which is initially grown in crystalline form doped with the acceptor impurity zinc to a concentration of about $10^{18}$ atoms per cm. and the donor impurity oxygen to a concentration of about $5 \times 10^{16}$ per $cm.^3$. The substrate is obtained from a crystal of GaP grown with the above impurities which is lapped and mechanically polished so as to obtain an upper surface for the substrate which corresponds to a {111} crystalline plane in the GaP material. The solid solution 26 is a GaP saturated Ga solution to which an *n* type impurity, here tellurium, is added.

With the solid solution 26 and substrate 24 in the boat 18, a cover 26 is placed on the boat and it is inserted in the quartz tube 10. The quartz tube is then placed in a furnace, the temperature is raised to about 1140° C., and forming gas is passed through the system from the inlet passage 12 to the outlet passage 14. This heating continues for a period of about 45 minutes after which the boat 18 is tipped so that the solution 26, now in liquid form, covers the surface of the substrate 24. The solution covered substrate is then cooled to a temperature of about 1000° C. within a period of about 30 minutes. The temperature is then lowered from 1000° C. to 700° C. in a period of about ten minutes. The furnace is then shut off to allow the substrate to cool down to room temperature.

The epitaxially overgrown substrate is then boiled in a solution of $1HCl:1H_2O$ to remove the excess Ga from the substrate. The epitaxial layer of n type GaP formed during the above-described process is about 60 to 80 microns in thickness. The overgrown crystal is cleaved at right angles to the overgrowth, that is along {110} plane to obtain the smaller units from which diodes are fabricated. These smaller units are lapped on the substrate side (p side) of the crystal to a thickness of about eight mils and from these units individual diode structures are cleaved which are triangular in form and have dimensions of less than one mm. on an edge.

Figure 4:
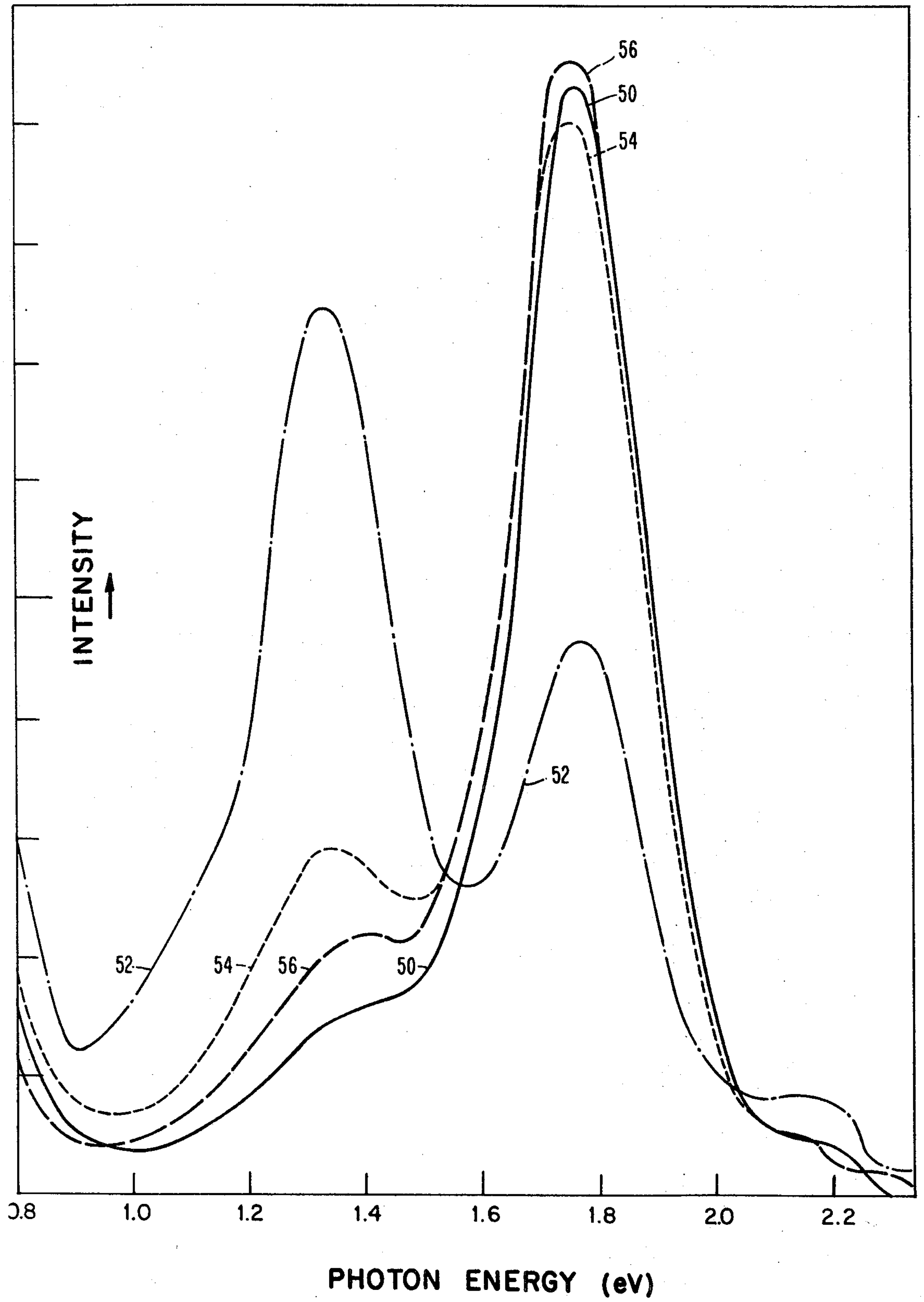
FIG. 4 is a plot indicating the relative intensity of red and infrared light emission produced by a GaP diode when first annealed at 900° C., and then at 600° C. for increasing periods of time.
Figure 5:
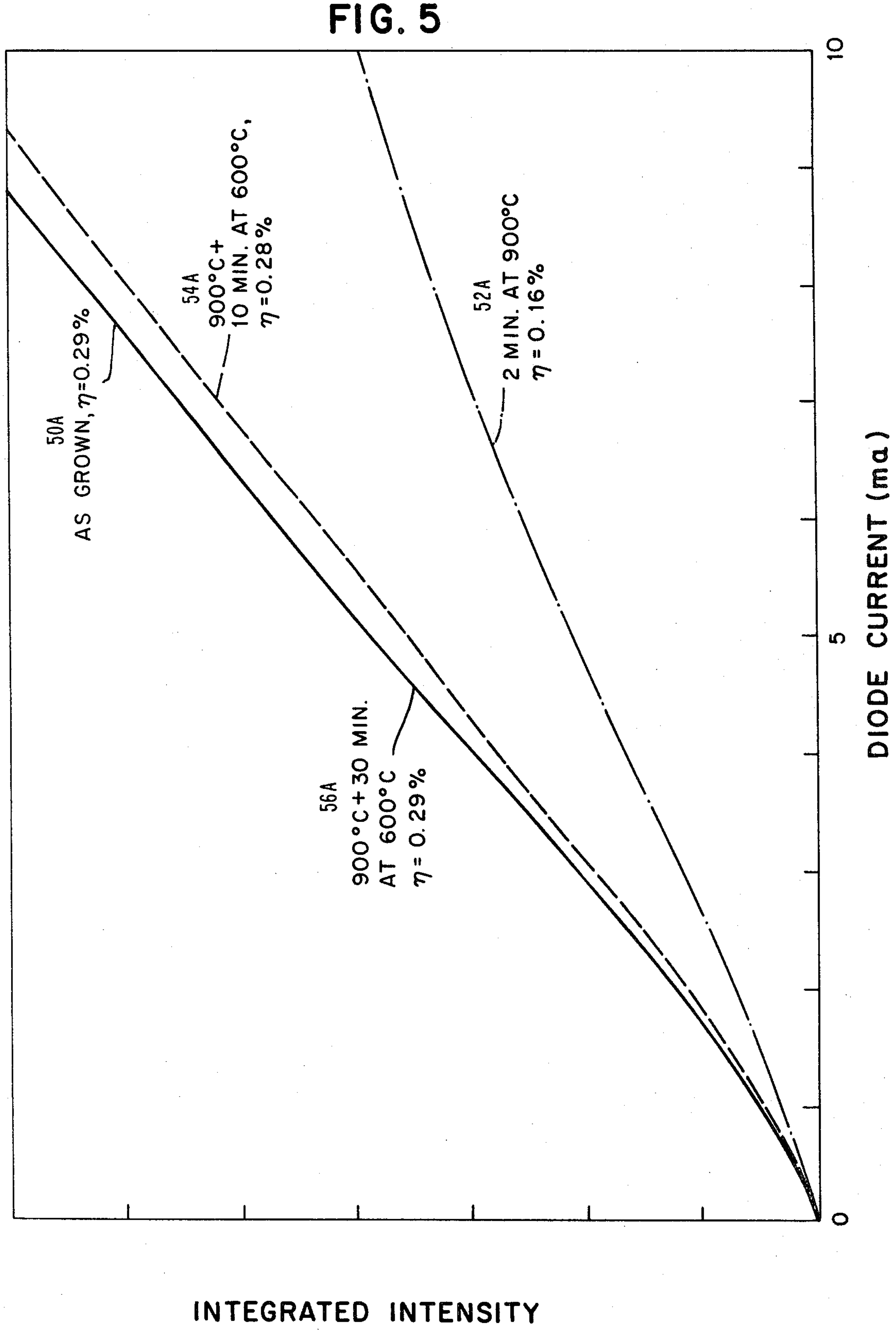
FIG. 5 is a plot of the integrated intensity of the output light, including both red and infrared, for different values of current applied to the GaP diode whose characteristics, when annealed, are plotted in FIG. 4; the slope of each curve of this figure is representative of the integrated efficiency of the diode after annealing at a particular temperature for a particular time.
Figure 6:
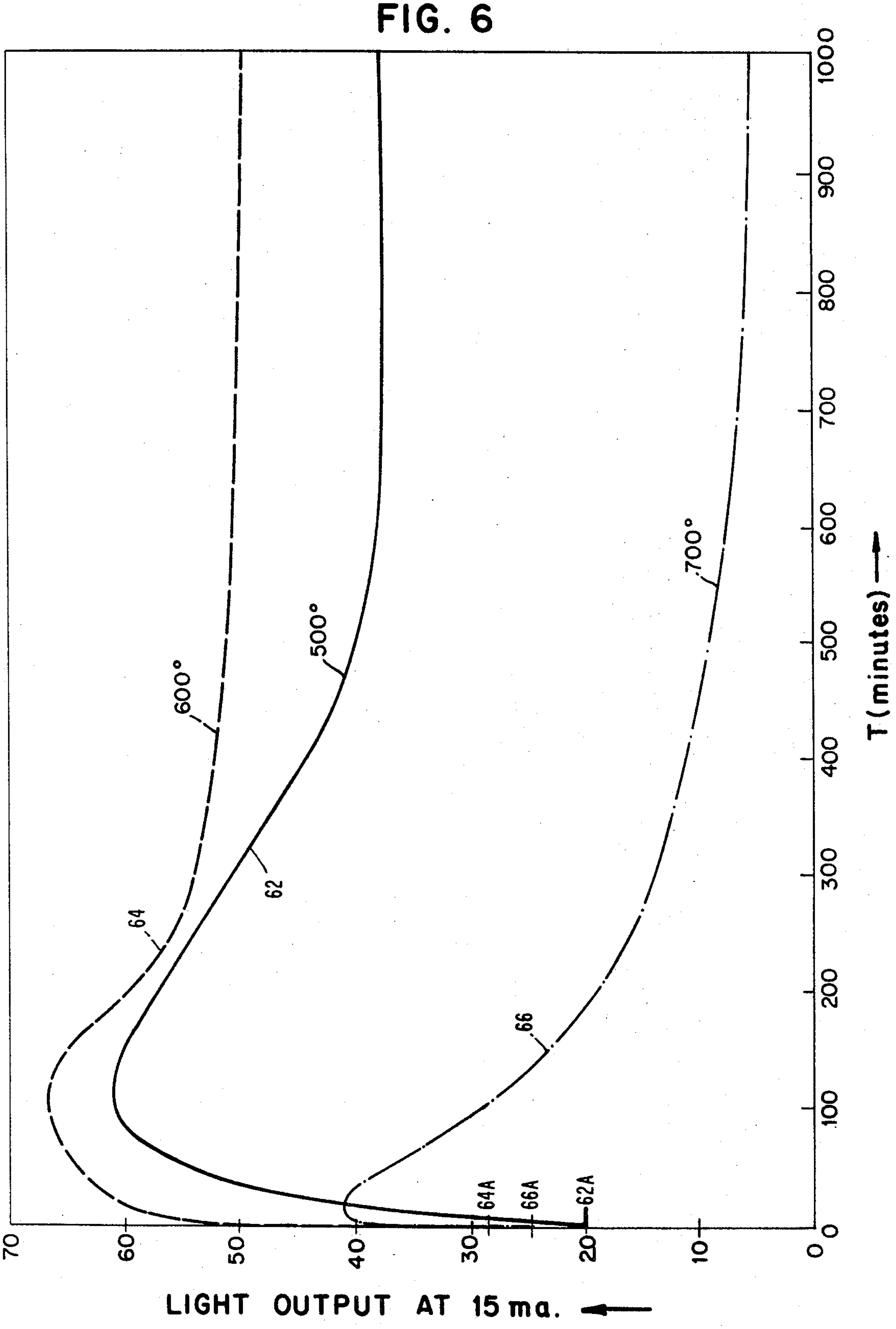
FIG. 6 is a plot indicating how the light output of GaP diodes varies for heat treatment at temperatures of 500° C., 600° C. and 700° C. over different periods of time.

The diodes are then heat treated, after which ohmic connections can then be made to the p and n regions, preferably using a low temperature alloying process. However, in order to illustrate how the light emitting characteristic of the diodes can be changed by different annealing processes, removable pressure type contacts were employed to provide the curves that are shown in FIGS. 4, 5 and 6 and are described below.

Figure 2:
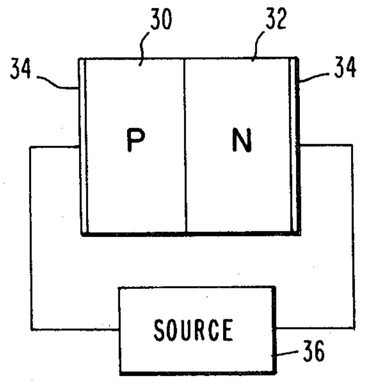
FIG. 2 is a schematic representation of a GaP diode.

A diode, prepared by the above-described process, is shown in FIG. 2. This diode includes a p region 30 and an n region 32. A pair of ohmic contacts 34 are made to these regions and these contacts are connected to a voltage source 36. Source 36 forward biases the junction between p region 30 and n region 32, causing electrons to be injected from region 32 to region 30. The injected electrons recombine in region 30 to produce the recombination radiation. Where, as here, the p region is doped with both the acceptor impurity zinc and the donor impurity oxygen, the recombination radiation includes components both in the infrared range (about 1.35 electron-volt) and in the red range (about 1.80 electron-volt).

Figure 3:
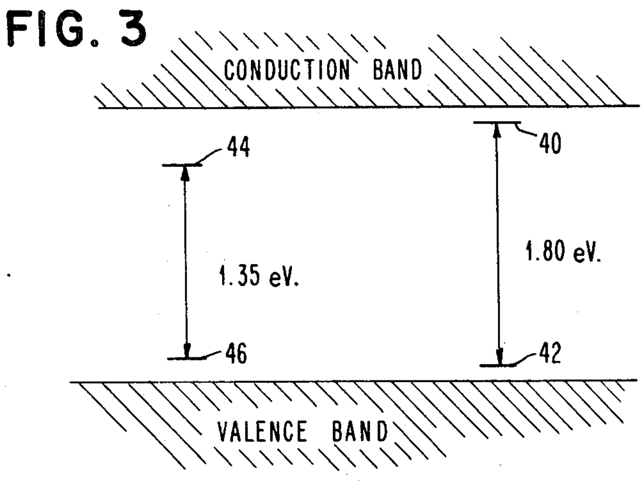
FIG. 3 is a representation of the energy structure within the p region of a GaP diode which illustrates the energy relationships for associated and dissociated pairs of zinc and oxygen atoms.

The energy transitions which produce these different frequency outputs are illustrated in FIG. 3, which is a diagrammatic showing of the energy relationships created by the zinc and oxygen impurities within the p region of the diode. These impurities may exist in either an associated or a dissociated state. When in an associated state, the zinc and oxygen atoms are located at nearest neighbor sites on the crystalline lattice and the binding energy between the atoms is strong. As a result, the energy levels produced by the paired atoms are separated from each other by a greater amount than is the case when the zinc and oxygen atoms are dissociated, that is when they are not located at nearest neighbor sites in the crystalline lattice. In the diagram of FIG. 3, the energy levels 40 and 42 indicate, respectively, the energy levels produced by zinc and oxygen atoms when they are associated with each other as nearest neighbors. The energy levels 44 and 46 show respectively the energy levels for zinc and oxygen atoms which are dissociated. As is evident from the drawing, the transition energy between levels 40 and 42 is about 1.80 electron-volt and is greater than the transition energy between levels 44 and 46, which is about 1.35 electron-volt.

Recombination radiation in the red corresponding to the 1.80 transition is produced when electrons are injected into the conduction band as shown in FIG. 3 and these electrons, probably by phonon transitions reach the energy level 40, from which they undergo radiative transitions to the energy level 42. Infrared radiation is produced in a like manner, except that the radiative transitions are from energy level 44 to energy level 46. The annealing process of the inventive method can be employed to cause the zinc and oxygen atoms to be driven into either an associated or dissociated state, and enhance the output in one frequency range at the expense of the output in the other frequency range. With GaP diodes of the type to which this invention is principally related, the red transition (1.80 electron-volt) is inherently more efficient, and it is also more desirable since these diodes are used primarily to produce visible light.

The temperature at which the diode is annealed determines whether the annealing drives the impurities into an associated or dissociated state. When the diodes are annealed at a higher temperature of about 900° C., more of the atoms are driven into a dissociated state. This follows from the fact that at this temperature the coulomb binding energy, which tends to hold associated pairs together, can be overcome by the thermal energy of the atoms at this high temperature. Therefore, heating of a diode at a temperature of 900° C. for even a very short time causes more of the impurity atoms to dissociate, lessens the efficiency of the red emission of the diode, and enhances the emission in the infrared. When a diode is annealed at a lower temperature, for example in the range between 450° C. and 700° C., the thermal energy of the atoms is less, the coulomb binding energy is about the same, and there is sufficient diffusion of the impurities, primarily zinc, to cause the zinc and oxygen atoms to be trapped as nearest neighbor pairs. The number of impurity atoms which are associated by the annealing is increased as the temperature of the annealing is lowered. However, if the temperature of the annealing is lowered below 450° C., the diffusion rate of the zinc atoms is so small that it takes an extremely long time to produce any significant association.

FIG. 4 is a plot which illustrates the manner in which the light output of a GaP diode can be changed between the red and infrared by annealing the diode at different temperatures. There are four curves 50, 52, 54 and 56 in this figure, and each curve illustrates the relative amount of infrared (1.35 peak) and red emission (1.80 peak) produced by the diode after a particular heat treatment step. It should be pointed out that the output characteristics of FIG. 4 were obtained at a temperature above room temperature, the reason being to magnify to at least some degree the relative amount of infrared radiation obtained. It should also be noted that the four curves are not drawn to the same scale, the purpose of this plot being to illustrate the relative amounts of radiation in the red and infrared achieved after various annealing steps. Curve 50 represents the output characteristic of the diode as originally grown. There is very little infrared radiation and a high degree of red radiation. Curve 52 illustrates the output for the same diode after heat treatment at 900° C. for a period of two minutes. As can be seen from this figure annealing at this temperature shifts the light output from red to infrared indicating that the heat causes the zinc and oxygen impurities to dissociate. Curve 54 illustrates the diode output when the heating at 900° C. is followed by heat treatment at 600° C. for ten minutes. As can be seen, this treatment restores a significant portion of the light output in the red and decreases the light output in the infrared. Curve 56 illustrates the diode output when heated at 600° C. for an additional twenty minutes so that the total period for heating at this temperature is thirty minutes. Again there is a shift from infrared to red so that the relative amount of red to infrared radiation is higher. The curves of FIG. 4 clearly illustrate that the heat treatment at the higher temperatures tends to dissociate the impurity atoms and enhance the infrared radiation at the expense of the red radiation. Subsequently heat treatment at the lower temperature 600° C., shifts the output radiation back from the infrared to the red since at this temperature the impurity atoms are associated with each other as nearest neighbors.

Particular note should be made of the fact that the treatment given the diode, whose characteristics are shown in FIG. 4, is carried out primarily to illustrate the manner in which selective annealing can shift the radiation back and forth between the red and infrared. When diodes are being fabricated to have optimum efficiency in the red, they would not be first annealed at the 900° C. temperature. Such heating is believed to produce effects which degrade the red emitting efficiency in such a way that it cannot all be recouped by subsequent heat treatment at lower temperatures. The curves do illustrate, however, a very simple way of testing a diode to determine whether or not heat treatment will improve its efficiency in the red. For example, if a diode is tested, using conventional spectrographic techniques, to determine the relative emission of red and infrared radiation, and an output characteristic such as that shown at 52 in FIG. 4 is obtained, it is clear that the diode includes a large number of impurity atoms which can be associated by proper heat treatment to enhance emission in the red.

FIG. 5 illustrates the integrated efficiency obtained for the same diodes whose characteristics after different enealing steps are shown in FIG. 4. In FIG. 5 the integrated intensity, including both red and infrared, is plotted against diode current. The slope of each of the curves is representative of the integrated efficiency $\eta$ for the diode after the particular heat treatment. The heat treatment steps are identified in FIG. 5 by the same numerals as are used in FIG. 3, with the letter A applied. As can be seen from curve 52A, the integrated efficiency is lowest after the heating for two minutes at 900° C. Subsequently heating at 600° C. for ten minutes raises the integrated efficiency (curve 54A). When the heating at 600° C. is extended to thirty minutes, the efficiency is essentially that of the diode before heat treatment, the curves 56A and 50A falling on top of each other. Again it should be emphasized that the heating step at 900° C. is not carried out if the diode output in the red is to be maximized.

Though it might be felt from the results depicted in the curves of FIGS. 4 and 5, that the heat treatment step at a particular temperature can be carried out for as long a time as desired to maximize the number of atoms in either the dissociated or associated state, this is not the case, as is indicated in the plot of FIG. 6. In this figure, three curves 62, 64 and 66 are plotted which represent the characteristics of three different GaP diodes, and more particularly the manner in which these characteristics are altered by prolonged heating at temperatures of 500° C., 600° C. and 700° C. In FIG. 6 the integrated light output for the diode is plotted as the ordinate and the heating time as the abscissa. As can be seen for the intercepts of the three curves 62, 64, and 66 with the ordinate at points 62A, 64A and 66A the diode which was heat treated at 600° C. had the best characteristic before heat treatment, and the diode heat treated at 500° C. exhibited the worst characteristic before heat treating. Referring to the curve 62, it can be seen that as this diode was heated at 500° C., and tests taken intermittently of the light output, the output characteristic continues to improve as the heating is continued for a period up to about 100–120 minutes. At this point a peak was reached and, thereafter, the over-all light output no longer increases with continued heating. Continued heating after three hours degrades the diode's characteristics and the severest degradation occurs between three and eight hours. Curve 64, which represents the characteristic of a diode heated at 600° C., indicates similar behavior in that heat treatment up to about 100–180 minutes produces the peak efficiency, and the enhancement produced by the initial heat treatment is degraded by further heating. The same general type of behavior is indicated by curve 66 for the diode heat treated at 700° C., with the exception that when the heat treatment is carried out at this higher temperature, the peak efficiency is reached after a very short time (about four to five minutes). Continued heating at this temperature quickly degrades the over-all performance.

The curves of FIG. 6 are illustrative of a large number of tests performed on such diodes. When the heat treatment is carried out at temperatures as low as 400° C., it appears that even for prolonged periods of heating very little improvement of efficiency is obtained. The minimum temperature at which the heat treatment can be carried out in reasonable times is about 450° C. and the maximum temperature at about 700° C. When in the lower portion of the temperature range, the heat treatment can be carried out for times up to about three hours, without the degradation which accompanies prolonged heating. In the higher temperature range the degradation appears to set in, in some diodes after only four or five minutes.

The phenomenon which produces the degradation of the diode characteristics with prolonged heating is not completely understood. It is believed that it might be due to diffusion of the zinc impurity into the junction region of the diode. Such diffusion would have a tendency to produce a very wide nonabrupt junction in the semiconductor device. In any event, regardless of the reason, it is clear that the best efficiency is obtained by heat treating in the range from about 450° C. to 700° C. for times of between three hours and four minutes with the higher annealing temperatures being used for the shorter time periods. It should also be pointed out that in many diodes, where prolonged heating beyond three hours is carried out, the original diode efficiency is improved (curves 62 and 64). However, optimum efficiency is achieved only by terminating the heating before the degradation effects reduce the efficiency from the maximum which is obtainable. It should also be noted that the annealing step need not be carried out completely at the same temperature between 400° C and 700° C. For example, heating at 600° C. for a period of 30 minutes can be employed and then the annealing temperature reduced to 500° C. for another 30 minutes to produce GaP diodes with enhanced light emitting characteristics in the red.

In the description of the invention, up to this point, the annealing step is carried out on diodes fabricated using a prior art solution growth process in a horizontal apparatus. The method has also been successfully applied to diodes which are solution grown in a vertical growth apparatus. However, it is not necessary that the annealing step be carried out after the diodes are completely fabricated. As was described above with reference to FIG. 1, in the convention solution growth process the temperature is raised to above 1140° C. at which time the solution 26 is caused to flow on top of the substrate 24 on which growth is to take place. Thereafter, the temperature is reduced to 1000° C. in a period of about 30 mnuites and then to the temperature of 700° C. in a period of ten minutes after which the diode is brought quickly to room temperature. The annealing process can be carried out during such a procedure, for example, by reducing the temperature from 700° C. to 500° C., and annealing the devices at this temperature for a perionod of about one hour before the temperature is brought to room temperature and the overgrown substrate is removed from the apparatus. Further, and of equal importance, the entire growth procedure can be modified to take advantage of the discoveries on which the inventive method is based. As was pointed out above, prolonged heating at higher temperatures in the range of 900° C., permanently lessens the efficiency of the diode to produce the desired red emission. It is, of course, necessary to heat the substrate and solid solution to 1140° C. to carry out the epitaxial growth process. However, the major portion of the growth takes place when the temperature is reduced from 1140° C. to 1000° C. In fact most of the growth actually takes place after the temperature is dropped from 1140° C. to about 1075° C. Thereafter, in order to avoid the exposure to higher temperatures for any time longer than is necessary than to grow the epitaxial portion to the desired thickness, the temperature is reduced from a temperature in the range of 1000° C. to 1100° C. quickly to a temperature below 700° C. The temperature may be quenched directly to room temperature by removing the tube from the oven, or the temperature may be quickly reduced to the temperature at which the annealing is to take place. The annealing process is carried out at the lower temperature for a time which is dependent on the temperature chosen.

While the invention has been particularly shown and described with reference to preferred embodiments thereof, it will be understood by those skilled in the art that various changes in form and details may be made therein without departing from the spirit and scope of the invention.

We claim:

1. A method of fabricating light emitting semiconductor devices of the type which include a recombination radiation region into which carriers are injected and which recombine to produce recombination radiation, comprising the steps of:

(a) forming said recombination radiation region of a semiconductor material doped with both an acceptor impurity and a donor impurity which can exist in said semiconductor in either an associated state in which the energy levels for recombination radiation are separated by a first transition energy or in a dissociated state in which the energy levels for recombination radiation are separated by a second transition energy which is less than said first transition energy;

(b) heat treating said diode at a temperature at which said impurities are driven to one of said states, and continuing the heating for a time sufficient to maximize the light emitting efficiency at one of said transition energies;

(c) and terminating said heating within three hours before the heating significantly degrades the efficiency of the diode for producing recombination radiation at one of said first and second transition energies.

2. The method of claim 1 wherein said first transition energy is in the visible portion of the spectrum and said second transition energy is in the nonvisible portion of the spectrum.

3. The method of claim 2 wherein said semiconductor material is GaP, said recombination region is a *p* type region and said heat treatment step is carried out at a temperature in the range between 450° C. and 700° C. for a time of three hours or less.

4. The method of claim 3 wherein said acceptor impurity is zinc and said donor impurity is oxygen.

5. The method of claim 4 wherein said device includes an $n$ region and a junction between said $p$ and $n$ regions, and at least one of said regions and said junction are formed by solution growth at a temperature above 1000° C., and said device is quickly cooled after said junction and one region are formed to a temperature between 450° C. and 700° C. at which said heat treatment is carried out.

6. The method of claim 1 including the step prior to said heat treatment of testing said device to determine the relative intensities of the recombination radiation at said first and second transition energies.

7. A method of fabricating light emitting semiconductor devices of the type which include a recombination radiation region into which carriers are injected which recombine to produce recombination radiation comprising the steps of:

(a) forming said recombination radiation region of a semiconductor material doped with both an acceptor impurity and a donor impurity which can exist in said semiconductor in either an associated state in which the energy levels for recombination radiation are separated by first transition energy or in a dissociated state in which the energy levels for recombination radiation are separated by a second transition energy which is less than said first transition energy;

(b) heat treating said device in a temperature range at which said donor and acceptor impurities are associated with each other, and continuing the heating for a time sufficient to achieve a high light emitting efficiency for said device and;

(c) and terminating said heating in said temperature range within three hours before the heating causes appreciable degradation of the light emitting efficiency produced by the initial heating.

8. The method of claim 7 wherein said device is a GaP diode containing a p region and an n region separated by a junction, said p region is the recombination region, said acceptor impurity is Zn, said donor impurity is oxygen and said heat treatment is carried out for a period of between one and two hours in a temperature range between 500° C. and 600° C. after which treating in said temperature is terminated.

9. The method of claim 8 wherein said heat treating is first carried out at a temperature in the upper portion of said temperature and then at a temperature in a lower portion of said temperature range before heating in said temperature range is terminated.

10. A method of fabricating light emitting semiconductor devices comprising the steps of:

(a) forming a GaP p-n junction device with the material on the p side of said device doped with both the acceptor impurity zinc and to a lesser degree with the donor impurity oxygen;

(b) and heat treating said device in a temperature range between 450° C. and 700° C. for a time between four minutes and three hours to enhance the light emitting efficiency of the diode in the visible portion of the electromagnetic spectrum.

11. The method of claim 10 wherein said diode is heat treated in a temperature range between 500° C. and 600° C. for a period of between thirty minutes and two hours.

12. The method of claim 11 wherein said diode is first heat treated at a temperature in the upper portion of said temperature range and then heat treated at a temperature in the lower portion of the temperature range.

13. The method of claim 10 wherin said junction is formed by solution growth at a temperature above 1000° C., and said device is then quickly cooled to a temperature below 700° C.

14. The method of claim 10 wherein prior to said heat treatment said device is tested to determine the relative intensities of the recombination radiation at frequencies in the visible and nonvisible portion of the electromagnetic spectrum.

15. A method of fabricating light emitting semiconductor devices of the type which include a recombination radiation region into which carriers are injected and which recombine to produce recombination radiation, comprising the steps of:

(a) forming said recombination radiation region of a semiconductor material doped with both an acceptor impurity and a donor impurity which can exist in said semiconductor in either an associated state in which the energy levels for recombination radiation are separated by a first transition energy or in a dissociated state in which the energy levels for recombination radiation are separated by a second transition energy which is less than said first transition energy;

(b) testing said device to determine the relative intensities of the recombination radiation at said first and second transition energies to determine whether the light emitting efficiency aat a particular one of said transition energies can be improved by heat treatment;

(c) and heat treating said device at a particular temperature for a particular time to maximize the light emitting efficiency at said particular transition energy.

16. A method of fabricating light emitting semiconductor devices comprising the steps of:

(a) forming a GaP p-n junction device with the material on the p side of said device doped with both the acceptor impurity zinc and to a lesser degree with the donor impurity oxygen by solution growth at temperatures above 1000° C.;

(b) maintaining said device at said temperatures above 1000° C. only for the time sufficient to form the junction therein and grow a layer on top of the junction to a particular thickness;

(c) and quickly reducing the temperature from said temperatures above 1000° C. directly to a temperature below 700° C. once said layer is grown to said desired thickness.

17. The method of claim 16 including the further step of heat treating said device in a temperature range between 450° C. and 700° C. for a time between four minutes and three hours.

References Cited

UNITED STATES PATENTS

| | | | |
|---|---|---|---|
| 3,365,630 | 11/1968 | Logan et al. | 317—237 |
| 3,470,038 | 10/1969 | Logan et al. | 148—171 |

L. DEWAYNE RUTLEDGE, Primary Examiner

ROBERT A. LESTER, Assistant Examiner

U.S. Cl. X.R.

148—13, 171, 172; 313—108; 317—235, 237